United States Patent [19]

Loehner et al.

[11] Patent Number: 5,347,239
[45] Date of Patent: Sep. 13, 1994

[54] STEP ATTENUATOR

[75] Inventors: Henry F. Loehner, Spokane, Wash.; Steven C. Zemke, Post Falls, Id.

[73] Assignee: Hewlett-Packard Company, Palo Alto, Calif.

[21] Appl. No.: 984,756

[22] Filed: Dec. 3, 1992

[51] Int. Cl.$^5$ .................................................. H01P 1/22
[52] U.S. Cl. .................................. 333/81 R; 333/81 A
[58] Field of Search ........................... 333/81 R, 81 A; 323/354

[56] References Cited

U.S. PATENT DOCUMENTS

| | | | |
|---|---|---|---|
| 4,556,808 | 12/1985 | Coats | 307/571 |
| 4,654,610 | 3/1987 | Dasilva | 333/81 R |
| 4,810,949 | 3/1989 | Schiemenz et al. | 323/354 |
| 4,912,394 | 3/1990 | Sugimoto et al. | 323/354 |
| 4,952,893 | 8/1990 | Cuddy | 333/81 R |
| 5,119,052 | 6/1992 | Witkowski et al. | 333/258 |
| 5,216,355 | 6/1993 | Terada et al. | 333/81 R X |

FOREIGN PATENT DOCUMENTS

| | | | |
|---|---|---|---|
| 78905 | 4/1987 | Japan | 333/81 R |
| 129401 | 4/1992 | Japan | 333/81 R |

OTHER PUBLICATIONS

GaAs MMIC Products catalog, Apr., 1992, excerpts pp. 1–28, 29; 2–22; 23; 2–60, 61; 2–62, 63, 2–64, 65.
Fink, D. G., et al., editors, Electronic Engineers' Handbook, pp. 12-50-12-59, 1975.
Schematic diagram, "Schematic RF Input Section," Mar. 6, 1991.
Schematic diagram, "Schematic, PWA Solid State Attenuator/R.P.P. Assy.," Feb. 25, 1991, (2 sheets).

*Primary Examiner*—Paul Gensler

[57] ABSTRACT

An RF step attenuator topology is optimized for use with GaAsFET switching devices, exploiting their high isolation while minimizing the effects of their relatively high insertion loss. The attenuator includes an attenuation network that has two inputs and two outputs, permitting four different attenuation levels to be selected by use of just one input switch and one output switch. The detailed embodiments feature high levels of attenuation (up to 140 dB in 10 dB steps), a minimum number of switches in the through-path (four), very wide band operation (250 KHz–2 GHz), and economical design.

22 Claims, 3 Drawing Sheets

FIG. 1
Prior Art
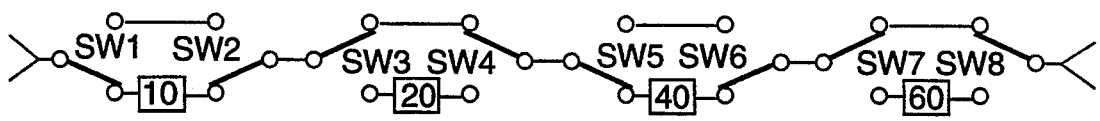
FIG. 2
Prior Art
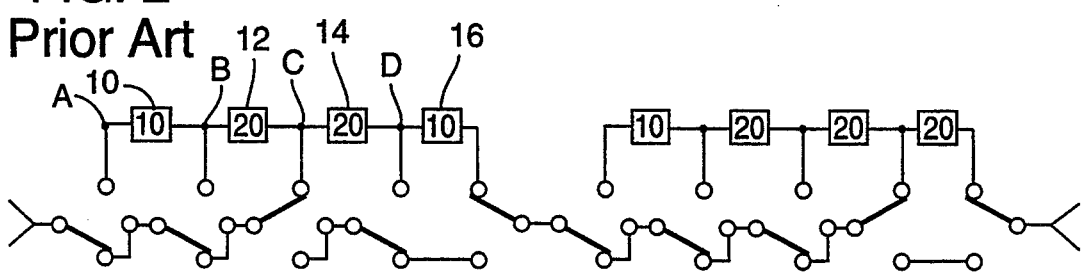
FIG. 3
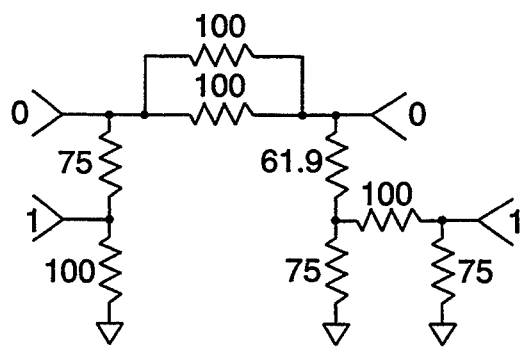
FIG. 4
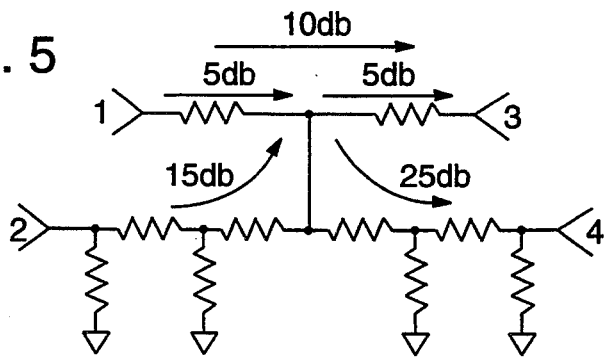
FIG. 5

STEP ATTENUATOR

BACKGROUND AND SUMMARY THE INVENTION

Step attenuators are commonly known and are used in a variety of electronic applications. Exemplary is the attenuator disclosed in U.S. Pat. No. 4,654,610 to DaSilva, which has been widely used in electronic test and measurement equipment.

Step attenuators rely on switches to selectably couple one or more attenuator pads (also known as "sections") into the circuit, thereby defining several different possible attenuation paths. In RF attenuators, the switches are generally activated by control signals which may be toggled by a computer or other control device. (Manually operated switches, such as rotary switches, are generally unsuitable for RF applications.) Among the switches commonly used in step attenuators are electromechanical RF relays and PIN diode switches. Electromechanical relays afford the advantages of high power handling capability, DC coupling, and isolation of the control signal from the signal being switched. PIN diodes offer lower cost and faster switching speed.

Gallium arsenide field effect transistor (GaAsFET) switches have been used in some step attenuator applications, but are generally considered disadvantageous due to their relatively high insertion loss (on the order of 0.8 dB at 1 GHz, as compared to about 0.2 dB for PIN diodes and electromechanical relays). GaAsFET switches do, however, offer superior "off-state" isolation, and are usable at higher frequencies than PIN diodes and relays.

Prior art step attenuators generally follow one of two basic topologies. The first, shown in FIG. 1, is termed a "series" attenuator and is characterized by a plurality of attenuator sections, each of which can be serially interconnected in the circuit, or alternately bypassed, by a corresponding pair of single pole, double throw (SPDT) switches. As can be seen, a series step attenuator with four attenuation pads (thereby defining 15 possible attenuation paths and a through path) requires eight such switches. (It will be recognized that four double-pole, double throw switches can alternatively be used. However, as used herein, "switches" are generally considered to mean single pole devices.)

The second basic step attenuator topology, termed a "ladder" attenuator, is characterized by a chain of serially-coupled attenuator pads, to which the input signal can be introduced at selected points. FIG. 2 shows two such ladder attenuators in series array. The first attenuator, comprised of attenuator pads 10, 12, 14 and 16, is shown as being driven by the input signal at point C, between pads 12 and 14, thereby providing 30 dB of attenuation. More or less attenuation can be provided by introducing the input signal at different points A, B or D in the chain. In this topology, a step attenuator with four attenuation pads (thereby defining four attenuation paths and a through-path) requires five switches.

In accordance with one aspect of the present invention, a new attenuator topology is disclosed that uses a reduced number of switches as compared with conventional designs. In the preferred embodiment, the attenuator topology is arranged to exploit GaAsFETs as switching elements, taking advantage of their high "off-state" isolation, while minimizing the impact of their relatively high insertion loss.

The foregoing and additional features and advantages of the invention will be more readily apparent from the following detailed description, which proceeds with reference to the accompanying drawings.

Brief Description of the Drawings

FIG. 1 is a schematic illustration of a prior art "series" attenuator topology.

FIG. 2 is a schematic illustration of a prior art "ladder" attenuator topology.

FIG. 3 is a schematic illustration of a multi-path attenuation circuit in accordance with one embodiment of the present invention.

FIG. 4 is a schematic diagram detailing a first implementation of the multi-path attenuation circuit of FIG. 3.

FIG. 5 is a schematic diagram detailing a second implementation of the multi-path attenuation circuit of FIG. 3.

DETAILED DESCRIPTION

Figure 6:
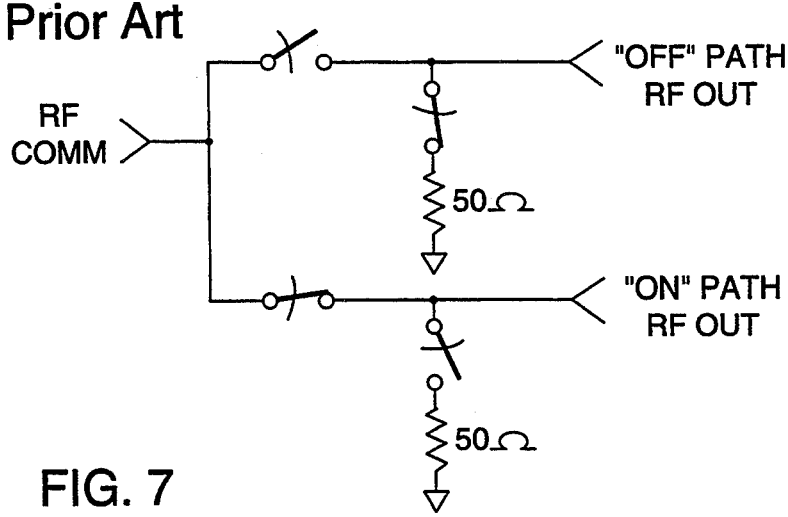
FIG. 6 is an equivalent circuit illustrating a "matched" SPDT GaAsFET switch.

Referring to FIG. 3, a multi-path attenuation circuit 18 in accordance with one embodiment of the invention includes input and output ports 20, 22, input and output switches 24, 26, and an attenuation network 28.

The input and output switches are depicted as SPDT mechanical switches, but can be implemented in a number of other technologies, including PIN diodes, electromechanical relays, or GaAsFET switches. GaAsFET switches packaged in IC form, such as Alpha AS002M2-12, or Alpha AS004M2-11, commercially available from Alpha Industries, Inc. of Woburn, Mass. are preferred for their high "off-state" isolation, as further detailed below.

The attenuation network 28 is a four port network with first and second input terminals 30, 32, and first and second output terminals 34, 36. Four paths are thereby defined through the network (30–34; 32–34; 30–36; and 32–36). The input switch 24 couples the input port 20 to one of the input terminals 30, 32, while the output switch 26 couples the output port 22 to one of the output terminals 34, 36. Thus, the two switches permit the input and output ports to be coupled together through any of the four network paths.

Inside the network are three attenuation sections 38, 40, 42. In the illustrated embodiment, these sections have attenuations of 10 dB, 10 dB and 20 dB, respectively. The first path through the network (30-34) includes just attenuation section 40, providing attenuation of 10 dB. The second path through the network (32-34) includes attenuation sections 38 and 40, providing a total attenuation of 20 dB. The third path through the network (30-36) includes attenuation sections 40 and 42, providing a total attenuation of 30 dB. The fourth path through the network (32-36) includes all three attenuation section 38-42, providing a total attenuation of 40 dB. Circuit 18 thus provides selectable attenuations of 10, 20, 30 or 40 dB while using only two switches.

Figure 7:
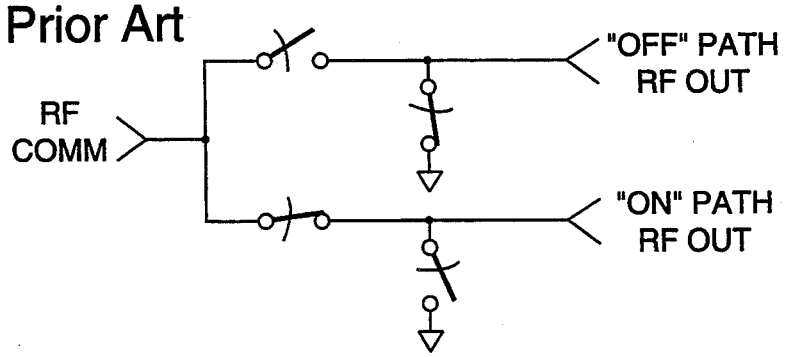
FIG. 7 is an equivalent circuit illustrating a "reflective" SPDT GaAsFET switch.

Network 28 can be implemented in a number of fashions, of which two are shown in FIGS. 4 and 5. These networks are designed to operate with all ports terminated in a characteristic impedance, here 50 ohms. Accordingly, the SPDT switches 24, 26 must be of the "matched" variety, providing a 50 ohm load to the "open" switch terminal. Such a switch is shown by its equivalent circuit schematic in FIG. 6. Another variety of switch, known as "reflective," is shown by the equivalent circuit schematic of FIG. 7. (Other reflective switches leave the "open" switch terminal unconnected, rather than shorted to ground. Both types result in full reflection of the incident signal back to the source.) Reflective switches can be used in other embodiments of the invention, as disclosed below. Both varieties of switches are available in GaAsFET IC form from Alpha. The component values shown in FIG. 4 correspond to the 10–40 dB attenuator of FIG. 3.

Figure 8:
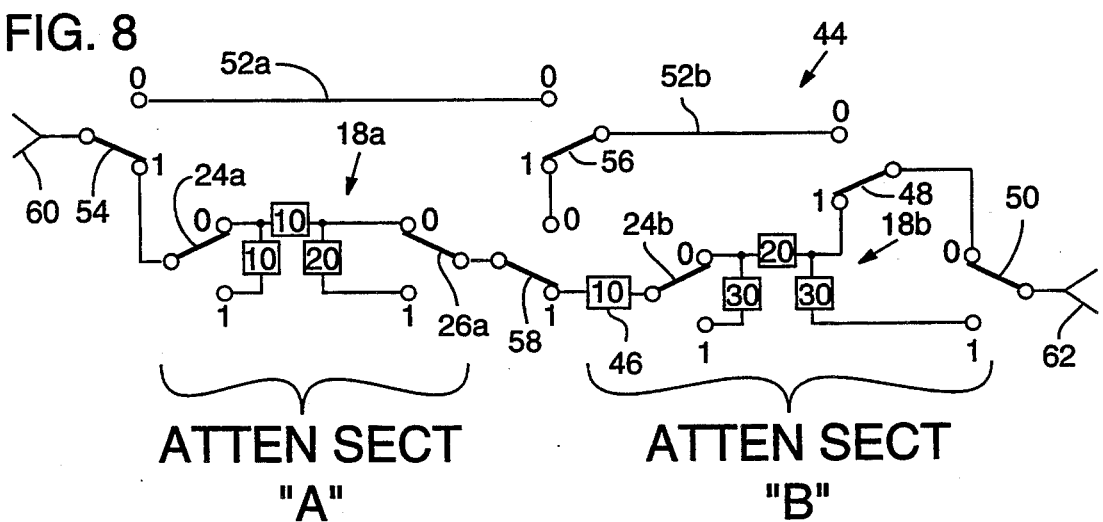
FIG. 8 is a schematic illustration of a step attenuator in accordance with a second embodiment of the present invention.

Referring next to FIG. 8, there is shown a 14 step (0–130 dB in 10 dB steps), 8 switch attenuator 44 built using two of the multi-path attenuation circuits 18a, 18b of FIG. 3, together with a fixed 10 dB pad 46. Circuit 18a provides 10 to 40 dB of attenuation in 10 dB steps. Circuit 18b provides 30 to 90 dB attenuation in 30 dB steps. (The output switch of circuit 18b is implemented using two switch sections 48, 50 to enhance through-path isolation.) Associated with each of multi-path attenuation circuits 18a, 18b is a corresponding through-path 52a, 52b. Switches 54, 56, and 58 complete the assembly. (Switches 54 and 56 provide a connection to, and a through-path around, attenuator section "A." Switch 58 allows the output of attenuator section "A" to be routed to either the through-path or the input to attenuator section "B.")

In any step attenuator, the "off-state" isolation provided by the switching elements (i.e. the isolation between the pole of the switch and the unconnected "throw" terminal) must be sufficiently high that leakage of the signal through an unintended path does not interfere with proper attenuator operation. Generally speaking, the leakage path should present at least 20 dB more attenuation than the intended path.

Sufficient isolation is particularly difficult to achieve in devices, such as the FIG. 8 attenuator 44, that provide extremely high levels of attenuation. When the illustrated attenuator is configured to provide 130 dB of attenuation in the intended path, the leakage path through the through-paths 52a, 52b should provide at least 150 dB of isolation.

Conventional PIN diodes and electromechanical relays provide isolation only on the order of 20 dB at 1 GHz. Accordingly, if such devices were used in a 130 dB attenuator, eight or more such switches would be required in the through-path in order to achieve the requisite degree of isolation. GaAsFET IC switches, in contrast, provide significantly higher levels of isolation (about 37 dB in plastic packaged IC versions; about 52 dB in hermetically sealed, ceramic packaged IC devices).

In the preferred embodiment, switches 24b, 48 and 50 provide at least 45 dB of "off" path isolation at the highest frequency of operation; the other switches provide at least 35 dB isolation. Ceramic packaged Alpha IC switches are thus used for the former; plastic packaged Alpha switches are used for the latter.

The attenuator is constructed using conventional printed circuit board techniques on FR4 board, with the artwork laid out to provide physical isolation between input and output to enhance the RF electrical isolation. The IC switches and the resistors comprising the attenuation networks are all surface mount devices. The completed circuit is mounted in a cast aluminum housing with spring gaskets for additional isolation.

As can be seen, this design includes only 4 SPDT switches (54, 56, 48, 50) in the through-path between input 60 and output 62. Thus, the through-path insertion loss for this design is only about 4 dB.

In the FIG. 8 attenuator 44, switches 24a, 26a, 24b, 48 and 50 must be of the matched type. Switches 54, 56 and 58 can be either matched or reflective.

To select the attenuator through-path (i.e. 0 dB nominal attenuation), switches 54, 56, 48 and 50 are set so that port 0 is the "on" path. The settings of the other switches are arbitrary. Selecting 10 to 40 dB of attenuation requires switches 54, 56 to be set to port 1, while switches 48, 50 and 58 are set to port 0. Switches 24a, 26a are then set as discussed previously to select 10 to 40 dB of attenuation in attenuator section "A."

50 to 70 dB of attenuation is achieved by setting switches 54, 56, 48 and 58 to port 1, while switches 24b and 50 are set to port 0. Attenuator section "B" then provides 30 dB of attenuation which is combined with 20 to 40 dB of attenuation in attenuator section "A" to give the desired value between 50 and 70 dB.

80 to 100 dB of attenuation is obtained by combining 60 dB of attenuation in section "B" with 20 to 40 dB of attenuation in section "A." Due to the symmetric nature of attenuator section "B," 60 dB of attenuation can be selected in two different ways, by setting switch 24b to port 1, or by setting switch 50 to port 1. It was decided arbitrarily that 60 dB of attenuation in section "B" is selected by setting switch 50 to port 1 with switch 24b set to port 0. Switches 54, 56, 48 and 58 are also set to port 1.

For all attenuation settings of 80 dB and higher, switches 48 and 50 are both connected to a port of attenuator section "B," but are isolated from each other. This arrangement routes the signal path through switch 50 with the additional 30 dB of attenuation in that path. The connection of switch 48 to attenuator section "B" is necessary to provide sufficient through-path isolation at high attenuation settings. The high isolation provided by switch 50 prevents coupling across the switch and leakage back into the lower attenuation port of attenuator section "B" from causing a problem.

110 to 130 dB of attenuation is obtained by a combination of 20 to 40 dB attenuation in section "A" and 90 dB attenuation in section "B." Switches 54, 56, 48, 50, 58, 24b are all set to port 1.

Table I shows attenuation section "A" and "B" values and switch setting for each attenuation level ("X" indicates a "don't care" switch state).

TABLE I

| Atten Level | Sect A | Sect B | Sw. 54 | Sw. 56 | Sw. 48 | Sw. 50 | Sw. 24a | Sw. 26a | Sw. 58 | Sw. 24b |
|---|---|---|---|---|---|---|---|---|---|---|
| 0 dB | X | X | 0 | 0 | 0 | 0 | X | X | X | X |
| 10 | 10 | X | 1 | 1 | 0 | 0 | 0 | 0 | 0 | X |
| 20 | 20 | X | 1 | 1 | 0 | 0 | 1 | 0 | 0 | X |
| 30 | 30 | X | 1 | 1 | 0 | 0 | 0 | 1 | 0 | X |
| 40 | 40 | X | 1 | 1 | 0 | 0 | 1 | 1 | 0 | X |
| 50 | 20 | 30 | 1 | 1 | 1 | 0 | 1 | 0 | 1 | 0 |
| 60 | 30 | 30 | 1 | 1 | 1 | 0 | 0 | 1 | 1 | 0 |
| 70 | 40 | 30 | 1 | 1 | 1 | 0 | 1 | 1 | 1 | 0 |
| 80 | 20 | 60 | 1 | 1 | 1 | 1 | 1 | 0 | 1 | 0 |
| 90 | 30 | 60 | 1 | 1 | 1 | 1 | 0 | 1 | 1 | 0 |
| 100 | 40 | 60 | 1 | 1 | 1 | 1 | 1 | 1 | 1 | 0 |
| 110 | 20 | 90 | 1 | 1 | 1 | 1 | 1 | 0 | 1 | 1 |
| 120 | 30 | 90 | 1 | 1 | 1 | 1 | 0 | 1 | 1 | 1 |
| 130 | 40 | 90 | 1 | 1 | 1 | 1 | 1 | 1 | 1 | 1 |

The 10 dB pad 46 between switch 58 and switch 24b provides isolation between multi-path attenuation circuits 18a and 18b such that interaction between the two is reduced to insignificance. The multi-path nature of the two attenuation sections 18a, 18b, and the ability to set the attenuation of each section independently of the other, allows calibration of the attenuator 44 without having to make measurements over a 130 dB dynamic range. Instead, the attenuator can be calibrated using a measurement range of 70 dB. If it is assumed that a measurement system noise floor 30 dB below the signal level being measured is sufficient to ensure noise contribution error is inconsequential, calibration of attenuator 44 can be done using a system with just 100 dB dynamic range. This is achievable using a network analyzer with a narrow IF bandwidth.

Calibration of the attenuator involves directly measuring the insertion loss of the device for attenuation settings 0 through 70 dB. Three additional measurements are made, one at 40 dB of attenuation, and two at 70 dB of attenuation, using non-standard switch positions. The calibration data for attenuation levels of 80 dB and higher are calculated from the measured values. Table II shows the attenuator levels that are measured directly for calibration and the calculations for the calibration of the higher attenuation settings.

TABLE II

| Atten Setting | Atten A | Atten B | Calibration Calculations |
|---|---|---|---|
| 0 | X | X | |
| 10 | 10 | X | |
| 20 | 20 | X | |
| 30 | 30 | X | |
| 40 | 40 | X | |
| 50 | 20 | 30 | |
| 60 | 30 | 30 | |
| 70 | 40 | 30 | |
| 40B* | 10 | 30 | *For calculation purposes only |
| 70B* | 10 | 60A | Switches 24b, 48 = 1; switch 50 = 0 |
| 70C* | 10 | 60B | Switches 28, 50 = 1; switch 24b = 0 |
| 80 | 20 | 60B | 50 + 70C − 40B |
| 90 | 30 | 60B | 60 + 70C − 40B |
| 100 | 40 | 60B | 70 + 70C − 40B |
| 110 | 20 | 90 | 50 + 70C + 70B − 2(40B) |
| 120 | 30 | 90 | 60 + 70C + 70B − 2(40B) |
| 130 | 40 | 90 | 70 + 70C + 70B − 2(40B) |

In the preferred embodiment, calibration data—taken at 34 different frequencies—is stored in an EEPROM memory on the attenuator circuit board, and is used to control the gain of an associated amplifier to compensate deviations from the intended attenuation factor.

An advantage of GaAsFET devices over PIN diode technology is that the former can be DC coupled, providing operation down to arbitrarily low frequencies. In the illustrated embodiment, the attenuator is used in an RF test instrument (particularly, an RF signal generator) having a lower frequency limit of 250 KHz, so operation all the way down to DC is not required. Thus in this embodiment, there is a blocking capacitor in the output circuit (not shown in FIG. 8 for clarity of illustration) to provide a pole at 31 KHz. In other embodiments, operation down to DC can be achieved.

Figure 9:
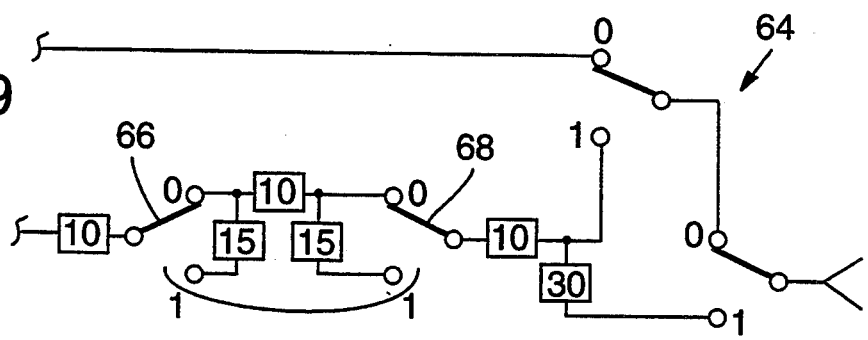
FIG. 9 is a schematic illustration of an alternative output topology that can be used in the step attenuator of FIG. 8.

A variety of related attenuator topologies will be apparent to those having skill in the art. Exemplary is the output network of FIG. 9. In this variant 64, a ninth switch is added to the attenuator. Adding the extra switch allows switches 66 and 68 to have only 35 dB of isolation for proper attenuator operation. This reduces by one the number of high isolation switches required in the attenuator with a resultant decrease in cost. Switches 66 and 68 are ganged together and operate the same as switch 24b in FIG. 8. Operation and calibration are identical to the circuit 44 previously described.

Figure 10:
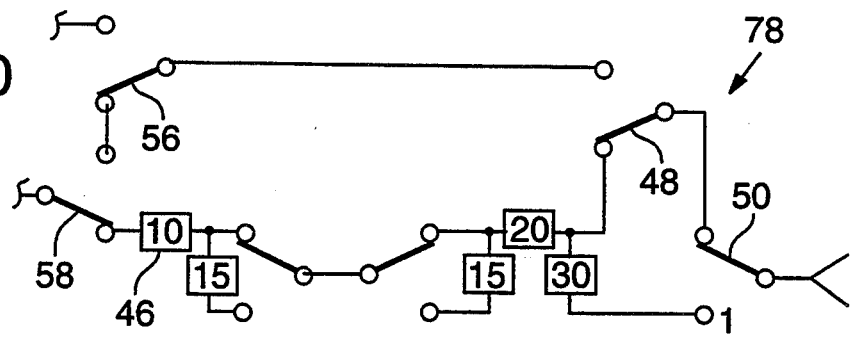
FIG. 10 is a schematic illustration of yet another output topology that can be used in the step attenuator of FIG. 8.

A closely related variant output network 78 is shown in FIG. 10. Again, this arrangement affords some economy in switch selection.

Figure 11:
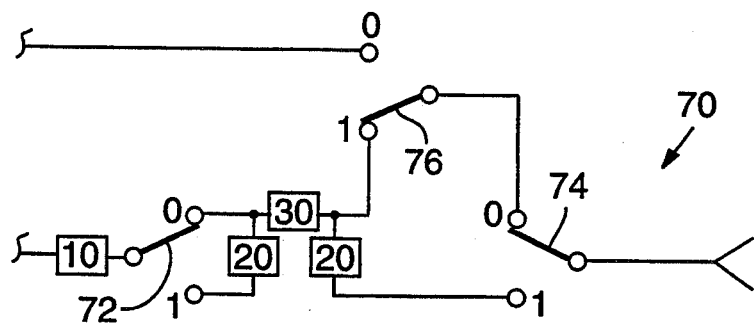
FIG. 11 is a schematic illustration of still another output topology that can be used in the step attenuator of FIG. 8.

A third variant output network 70, used in an 8-switch, 120 dB attenuator, is shown in FIG. 11. In this embodiment, switches 72 and 74 can be 35 dB isolation switches, leaving only switch 76 as a high isolation switch. This version has 120 dB maximum attenuation and requires 70 dB measurement range for calibration.

A 10 dB step, 140 dB range attenuator can be realized by changing the 30/60/90 dB attenuator section "B" in FIG. 8 to a 40/70/100 dB section. One way in which this can be done is to change the 10 dB pad 46 to a 20 dB pad. This necessitates some changes in the switch isolations, particularly the substitution of a high-isolation switch for switch 58.

Figure 12:
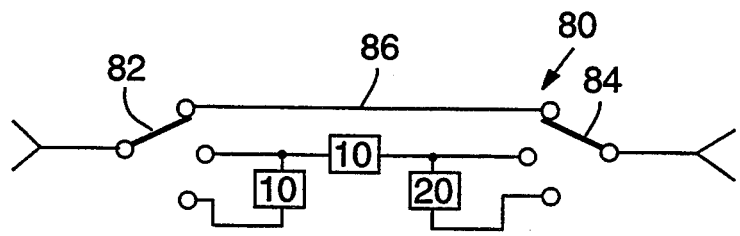
FIG. 12 shows a four-path network employing SP3T switches at the input and the output.
Figure 13:
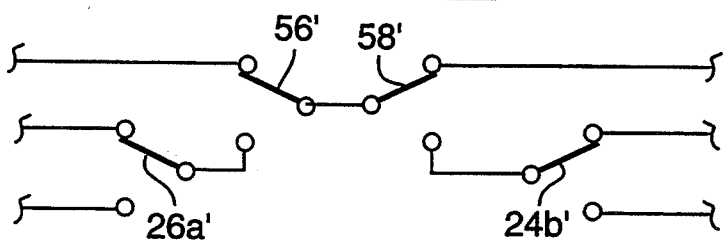
FIG. 13 shows an alternative switch arrangement usable in the FIG. 8 attenuator.

Still other variant topologies are shown in FIGS. 12–13. FIG. 12 shows a multi-path network 80 employing SP3T switches 82, 84 at the input and the output. The third throw of these switches permits connection to a through-path 86. FIG. 13 shows a revised switch arrangement based on the topology of FIG. 8, wherein switch 58' is moved to the through-path.

From the foregoing, it will be recognized that attenuator 44 offers a number of advantages over the prior art. One is a reduced number of switches in the through-path. This permits GaAsFET IC switches, with their relatively higher insertion loss, to be used while maintaining a relatively low (i.e. 4 dB) through-path insertion loss. Further, the topology is arranged to take advantage of the high isolation provided by GaAsFET IC switches, simplifying the implementation of attenuators with very high attenuation levels. Calibration can be accomplished with a measurement instrument having a dynamic range less than the maximum attenuation. Yet another advantage is cost: the illustrated printed circuit board-based design, using off-the-shelf parts, is much less expensive to implement than other microwave attenuators, which typically rely on custom microcircuit fabrication techniques.

The use of GaAsFET SPDT IC switches provides further advantages. One is better reliability than electro-mechanical designs. Another is that GaAsFETs require less power to operate than either PIN diodes or electro-mechanical relays, reducing power dissipation and simplifying the associated drive circuitry. The drive circuitry is further simplified by control of the GaAsFETs via their gate terminals. The problem of isolating the control signal from the RF signal, such as by RF chokes, etc., is thus avoided. GaAsFETs also permit the RF path to be DC coupled, providing wider frequency coverage than PIN diode-based designs. And, as noted earlier, GaAsFETs can be operated at higher frequencies than other devices.

Having described and illustrated the principles of our invention with reference to several preferred embodiments thereof, it will be apparent that the invention can be modified in arrangement and detail without departing from such principles. For example, while the invention has been illustrated with reference to multi-path attenuation networks having two input terminals and two output terminals, yielding a total of four attenuation paths, it will be recognized that other networks can be designed having a greater number of such terminals, yielding a greater number of attenuation paths. For example, networks with three input terminals and three output terminals can be utilized, in conjunction with SP3T input and output switches, to define nine possible attenuation paths. Still further, while the invention has been illustrated with reference to embodiments employing one or two multi-path attenuation circuits 18, it will be recognized that advantageous combinations can be achieved with three or more such circuits. Further, such circuits can be selectably combined with one or more fixed attenuation pads.

Figure 14:
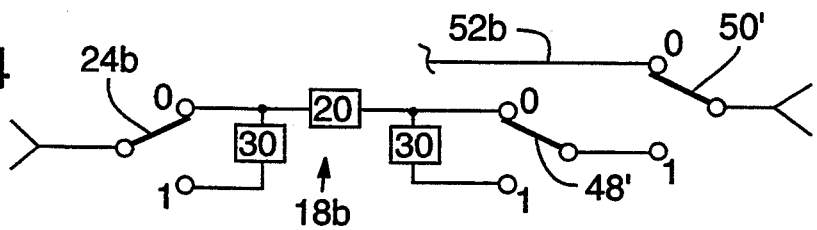
FIG. 14 shows an alternative switch arrangement usable in the FIG. 8 attenuator.

Similarly, while the invention has been illustrated with reference to implementation using surface mount devices on a printed circuit board, it will be recognized that other construction techniques can be used. For example, operation up past 5 GHz can be achieved by implementing the attenuator in microcircuit form, with the resistors realized using thick film techniques and by incorporating the GaAsFET switches on the microcircuit substrate. Still further, while the invention has been illustrated with reference to a topology in which the through-path is interrupted with a number of switches in order to increase "off-state" isolation, it will be recognized that fewer through-path switches can be used in embodiments in which such high isolation is not required (or in which such isolation can be achieved with a fewer number of higher isolation devices). In FIG. 8, for example, switches 48 and 50 could be arranged to mirror image switches 54 and 24a, thereby requiring only three switches in the through-path, instead of the four illustrated. FIG. 14 illustrates this alternative switch arrangement.

A number of other variants will likewise be apparent to those skilled in the art.

In view of the wide variety of embodiments to which the principles of our invention can be applied, it should be understood that the detailed embodiments are illustrative only and should not be taken as limiting the scope of our invention. Rather, we claim as our invention all such modifications as may come within the scope and spirit of the following claims and equivalents thereto.

We claim:

1. A multi-step RF attenuation circuit comprising an input port and an output port, each presenting a characteristic impedance that matches a predetermined characteristic impedance, at least four attenuation paths and a through-path interposed between the input and output ports, and electronic switches for routing an input signal through any of said paths, wherein the through path includes two or three switches.

2. The multi-step RF attenuation circuit of claim 1 wherein the through-path includes only two switches.

3. The multi-step RF attenuation circuit of claim 1 wherein the total number of switches is less than five.

4. A multi-step RF attenuator comprising an input port and an output port, each presenting a characteristic impedance that matches a predetermined characteristic impedance, at least five attenuation paths and a through-path interposed between the input and output ports, and electronic switches for routing an input signal through any of said paths wherein the through-path includes less than six switches and more than one switch.

5. The multi-step attenuator of claim 4 that includes at least seven attenuation paths, and wherein the through-path includes less than five switches.

6. The multi-step attenuator of claim 5 that includes at least nine attenuation paths.

7. The multi-step attenuator of claim 5 that includes at least eleven attenuation paths.

8. The multi-step attenuator of claim 5 that includes at least thirteen attenuation paths.

9. A multi-path RF attenuation circuit comprising:
an input port and an output port;
an attenuation network having at least first and second input terminals and at least first and second output terminals, the network having at least four attenuation paths between the input and the output terminals;
input matched switch means for coupling the input port to one of said at least first and second network input terminals;
output matched switch means for coupling one of said at least first and second network output terminals to the output port;
wherein the input and output switch means permit the input and output ports to be coupled through any of the at least four attenuation paths.

10. The multi-path attenuation circuit of claim 9 in which the switch means comprise GaAsFET switches in integrated circuit form.

11. The multi-path attenuation circuit of claim 9 in which the switch means are DC coupled.

12. The multi-path attenuation circuit of claim 9 in which at least one of the attenuation paths presents an attenuation in excess of 65 dB at 1 GHz.

13. A multi-step attenuating network comprising:
first and second multi-path attenuation circuits according to claim 9;
a master input;
a master output;

a first through-path corresponding to the first multi-path attenuation circuit, the first through-path having an input and an output;

a second through-path corresponding to the second multi-path attenuation circuit, the second through-path having an input and an output;

first through-path switch means for coupling the master input to either the input port of the first multi-path attenuation circuit or to the input of the first through-path;

second through-path switch means for coupling the input of the second through-path to either the output of the first through-path or the output port of the first multi-path attenuation circuit;

the second through-path switch means further including means for coupling the output port of the first multi-path attenuation circuit to the input port of the second multi-path attenuation circuit; and third through-path switch means for coupling the master output to either the output port of the second multi-path attenuation circuit or to the output of the second through-path.

14. The multi-step attenuation network of claim 13 which further includes an attenuation element coupled between the input port of the second multi-path attenuation circuit and the second through-path switch means.

15. The multi-step attenuation network of claim 13 in which the second through-path switch means comprises:

a first section having a pole coupled to the input of the second through-path and a first throw coupled to the output of the first through-path; and a second section having a pole coupled to the output of the first multi-path attenuation circuit, a first throw coupled to the input of the second multi-path attenuation circuit, and a second throw coupled to a second throw of the first section.

16. The multi-step attenuation network of claim 13 in which the third through-path switch means includes the output switch means of the second multi-path attenuation circuit, and comprises:

a first section having a pole coupled to the master output, and a first throw coupled to the second output terminal of the second multi-path attenuation circuit; and a second section having a pole coupled to a second throw of the first section, a first throw coupled to the output of the second through-path, and a second throw coupled to the first output terminal of the second multi-path attenuation circuit.

17. The multi-step attenuation network of claim 13 in which the switch means comprise GaAsFET switches in integrated circuit form.

18. The multi-step attenuation network of claim 13 in which the switch means are DC coupled.

19. The multi-step attenuation network of claim 13 characterized by a maximum attenuation in excess of 100 dB at 1 GHz.

20. The multi-step attenuation network of claim 13 characterized by a maximum attenuation in excess of 125 dB at 1 GHz.

21. A multi-step RF attenuation circuit comprising an input port and an output port, each presenting a characteristic impedance that matches a predetermined characteristic impedance, at least four attenuation paths and a through-path interposed between the input port and the output port, and a first switch coupled to the input port and a second switch coupled to the output port, the first and the second switches having at least two throws for selectively routing an input signal through any of said paths.

22. The multi-step RF attenuation circuit of claim 21 wherein the first and second switches have at least three throws for selectively routing an input signal through any of said paths.

* * * * *